(12) United States Patent
Cooper et al.

(10) Patent No.: US 10,476,519 B2
(45) Date of Patent: Nov. 12, 2019

(54) SYSTEM AND METHOD FOR HIGH-SPEED TRANSFER OF SMALL DATA SETS

(71) Applicant: AtomBeam Technologies Inc., Moraga, CA (US)

(72) Inventors: Joshua Cooper, Columbia, SC (US); Aliasghar Riahi, Orinda, CA (US); Mojgan Haddad, Orinda, CA (US); Ryan Kourosh Riahi, Orinda, CA (US); Razmin Riahi, Orinda, CA (US); Charles Yeomans, Orinda, CA (US)

(73) Assignee: AtomBeam Technologies Inc., Moraga, CA (US)

(*) Notice: Subject to any disclaimer, the term of this patent is extended or adjusted under 35 U.S.C. 154(b) by 0 days.

(21) Appl. No.: 16/200,466

(22) Filed: Nov. 26, 2018

(65) Prior Publication Data

US 2019/0140658 A1   May 9, 2019

Related U.S. Application Data

(63) Continuation-in-part of application No. 15/975,741, filed on May 9, 2018, now Pat. No. 10,303,391.

(60) Provisional application No. 62/578,824, filed on Oct. 30, 2017.

(51) Int. Cl.
*H03M 7/40* (2006.01)
*H03M 7/30* (2006.01)

(52) U.S. Cl.
CPC ....... *H03M 7/4012* (2013.01); *H03M 7/3088* (2013.01); *H03M 7/405* (2013.01); *H03M 7/4062* (2013.01)

(58) Field of Classification Search
None
See application file for complete search history.

(56) References Cited

U.S. PATENT DOCUMENTS

| | | |
|---|---|---|
| 7,886,119 B1 | 2/2011 | Cameron et al. |
| 8,456,333 B1 | 6/2013 | Semenyuk et al. |
| 2009/0002207 A1* | 1/2009 | Harada ............... H03M 7/3086 341/51 |
| 2010/0223237 A1 | 9/2010 | Mishra et al. |
| 2012/0078978 A1* | 3/2012 | Shoolman ........... H03M 7/3088 707/803 |
| 2012/0166818 A1 | 6/2012 | Orsini et al. |
| 2014/0250300 A1 | 9/2014 | Runkis et al. |
| 2017/0250708 A1* | 8/2017 | Blaettler ................. H03M 7/42 |

FOREIGN PATENT DOCUMENTS

EP    3094001 A1    11/2016

* cited by examiner

*Primary Examiner* — Michael Alsip
(74) *Attorney, Agent, or Firm* — Brian R. Galvin; Galvin Patent Law, LLC

(57) ABSTRACT

A system and method for high-speed transfer of small data sets, that provides near-instantaneous bit-level lossless compression, that is ideal for communications environments that cannot tolerate even small amounts of data corruption, have very low latency tolerance, where data has a low entropy rate, and where every bit costs the user bandwidth, power, or time so that deflation is worthwhile. Where some loss of data can be tolerated, the system and method can be configured for use as lossy compression.

10 Claims, 10 Drawing Sheets

SYSTEM AND METHOD FOR HIGH-SPEED TRANSFER OF SMALL DATA SETS

CROSS REFERENCE TO RELATED APPLICATIONS

This application is a continuation-in-part of U.S. patent application Ser. No. 15/975,741, titled "SYSTEM AND METHOD FOR DATA STORAGE, TRANSFER, SYNCHRONIZATION, AND SECURITY", filed on May 9, 2018, which claims priority to U.S. provisional patent application 62/578,824 titled "MASSIVE DATA STORAGE, TRANSFER, SYNCHRONIZATION, AND SECURITY SYSTEM", filed on Oct. 30, 2017, the entire specifications of each of which are incorporated herein by reference.

BACKGROUND OF THE INVENTION

Field of the Invention

The present invention is in the field of computer data storage and transmission.

Discussion of the State of the Art

In order to take advantage of the rapidly-growing and transformative power of modern computing, the ability to quickly transmit data between computing endpoints is indispensable. Such high-throughput communication is under constant strain, and the problem will only grow with time as technology improves. There are many solution strategies used or under development to enable the passing of ever-greater flow of data over different types of computing interconnects, such as sophisticated routing algorithms for network hubs and data buses, exploitation of new physics to enable deeper multiplexing, highly parallelized hardware and meticulously engineered standards for wireless data transmission, nanoscale circuit geometry for onboard data flow control, just to name a few.

One particularly important paradigm that is both extremely general and effective is compression, or "source coding", dating back in our modern understanding to the seminal 1948 work of Clause Shannon. During the 1970s, 80s, and 90s, lossless compression algorithms grew increasingly sophisticated, gaining in speed, growing in capacity, and approaching an efficiency close to Shannon's "entropy bound". This central theorem of information theory states that the compression ratio (also referred to as the "compression power" or "deflation factor"—the ratio of the size of the compressed data to the size of the source data) can never exceed on average the encoded random variable's entropy rate (the density, measured in bits, of revealed information). While classical approaches such as Huffman Coding and Lempel-Ziv-Welch (LZW) are theoretically optimal asymptotically, their various widely-used implementations can be painfully slow and perform poorly on short data streams in addition to being extremely sensitive to noise and nearly impossible to employ for random access. This is due to practical constraints of file systems, memory constraints, and the like, but is also a consequence of the historical focus of such methods on encoding larger files for storage purposes. Even the most cutting-edge compression algorithms such as Broth and Zstd designed to handle short files do not provide much benefit below a filesize of around 1 kilobyte, or 80000 bits, and are usually used for much larger files.

What is needed is a new solution that provides near-instant bit-level lossless compression, suitable for use on very small amounts of data suitable for storage or transmission without data loss or corruption.

SUMMARY OF THE INVENTION

The inventor has developed a system and method for high-speed transfer of small data sets, that provides near-instantaneous bit-level lossless compression, that is ideal for communications environments that cannot tolerate even small amounts of data corruption, have very low latency tolerance, where data has a low entropy rate, and where every bit costs the user bandwidth, power, or time so that deflation is worthwhile.

Examples of applications of the invention include vehicular crash sensors, electronic stock trading, instant messaging, explosion and radioisotope detectors, datacenter interconnects, implantable medical devices, security motion sensors, astronomical observation devices, and telephony.

According to a preferred embodiment, a system for high-speed transfer of small data sets is disclosed, comprising: a customized library generator comprising at least a plurality of programming instructions stored in the memory of, and operating on at least one processor of, a computing device, wherein the plurality of programming instructions, when operating on the at least one processor, cause the computing device to: receive a first dataset comprising a plurality of words, each word comprising a string of bits, wherein the first dataset is believed to be representative of subsequent datasets; count the plurality of words to produce an occurrence frequency for each word; create a first Huffman binary tree based on the frequency of occurrences of each word in the first dataset; assign a Huffman codeword to each observed word in the first dataset according to the first Huffman binary tree; construct a word library, wherein the word library stores the codewords and their corresponding words as key-value pairs in the library of key-value pairs; create a second Huffman binary tree with a maximum codeword length shorter than the maximum codeword length in the first Huffman binary tree, and containing all combinations of such codewords to that shorter maximum length; assign a word to each Huffman codeword in the second Huffman binary tree; and add each word and its corresponding codeword, to the word library as key-value pairs in the library of key-value pairs; a transmission encoder comprising at least a plurality of programming instructions stored in the memory of, and operating on at least one processor of, a computing device, wherein the plurality of programming instructions, when operating on the at least one processor, cause the computing device to: receive one or more subsequent datasets, each comprising a plurality of words, each word comprising a string of bits; compare each word in the subsequent dataset or datasets against the word library; if a word is not a mismatch, append the word's codeword to a transmission data stream; if a word is a mismatch, append a mismatch code to the transmission data stream followed by the unencoded word; and transmit or store the transmission data stream; a transmission decoder, comprising at least a plurality of programming instructions stored in the memory of, and operating on at least one processor of, a computing device, wherein the plurality of programming instructions, when operating on the at least one processor, cause the computing device to: receive one or more datasets, each comprising a plurality of codewords, each codeword comprising a string of bits; compare each codeword in the dataset or datasets against the word library; if a codeword is not a mismatch, append the codeword's word to a transmission data stream; if a codeword is a mismatch codeword, discard the mismatch code and append the following word to the transmission data stream; and transmit or store the transmission data stream; a hybrid encoder comprising at least a plurality of programming instructions stored in the memory of, and operating on at least one processor of, a computing device, wherein the plurality of programming instructions, when operating on the at least one processor, cause the computing device to: receive mismatched words from the transmission encoder; parse the mismatched words into partial words that correspond to a codeword in the second Huffman tree; and return the codeword for each partial word to the transmission encoder; and a hybrid decoder comprising at least a plurality of programming instructions stored in the memory of, and operating on at least one processor of, a computing device, wherein the plurality of programming instructions, when operating on the at least one processor, cause the computing device to: receive mismatched codewords from the transmission decoder; compare each codeword against the word library; and return the word associated with the mismatched codeword to the transmission encoder.

According to another preferred embodiment, a method for high-speed transmission of small data sets using a word library is disclosed, comprising the steps of: receiving a first dataset comprising a plurality of words, each word comprising a string of bits, wherein the first dataset is believed to be representative of subsequent datasets; counting the plurality of words to produce an occurrence frequency for each word; creating a first Huffman binary tree based on the frequency of occurrences of each word in the first dataset; assigning a Huffman codeword to each observed word in the first dataset according to the first Huffman binary tree; constructing a word library, wherein the word library stores the codewords and their corresponding words as key-value pairs in the library of key-value pairs; creating a second Huffman binary tree with a maximum codeword length shorter than the maximum codeword length in the first Huffman binary tree, and containing all combinations of such codewords to that shorter maximum length; assigning a word to each Huffman codeword in the second Huffman binary tree; adding each word and its corresponding codeword, to the word library as key-value pairs in the library of key-value pairs; receiving, at a transmission encoder one or more subsequent datasets, each comprising a plurality of words, each word comprising a string of bits; comparing each word in the subsequent dataset or datasets against the word library; if a word is not a mismatch, appending the word's codeword to a transmission data stream; if a word is a mismatch, appending a mismatch code to the transmission data stream followed by the unencoded word; transmitting or storing the transmission data stream; receiving, at a transmission decoder, one or more datasets, each comprising a plurality of codewords, each codeword comprising a string of bits; comparing each codeword in the dataset or datasets against the word library; if a codeword is not a mismatch, append the codeword's word to a transmission data stream; if a codeword is a mismatch codeword, discard the mismatch code and append the following word to the transmission data stream; transmitting or storing the transmission data stream; receiving, at a hybrid encoder, mismatched words from the transmission encoder; parsing the mismatched words into partial words that correspond to a codeword in the second Huffman tree; returning the codeword for each partial word to the transmission encoder; receiving, at a hybrid decoder, mismatched codewords from the transmission decoder; comparing each codeword against the word library; and returning the word associated with the mismatched codeword to the transmission encoder.

BRIEF DESCRIPTION OF THE DRAWING FIGURES

The accompanying drawings illustrate several aspects and, together with the description, serve to explain the principles of the invention according to the aspects. It will be appreciated by one skilled in the art that the particular arrangements illustrated in the drawings are merely exemplary, and are not to be considered as limiting of the scope of the invention or the claims herein in any way.

DETAILED DESCRIPTION

Figure 1:
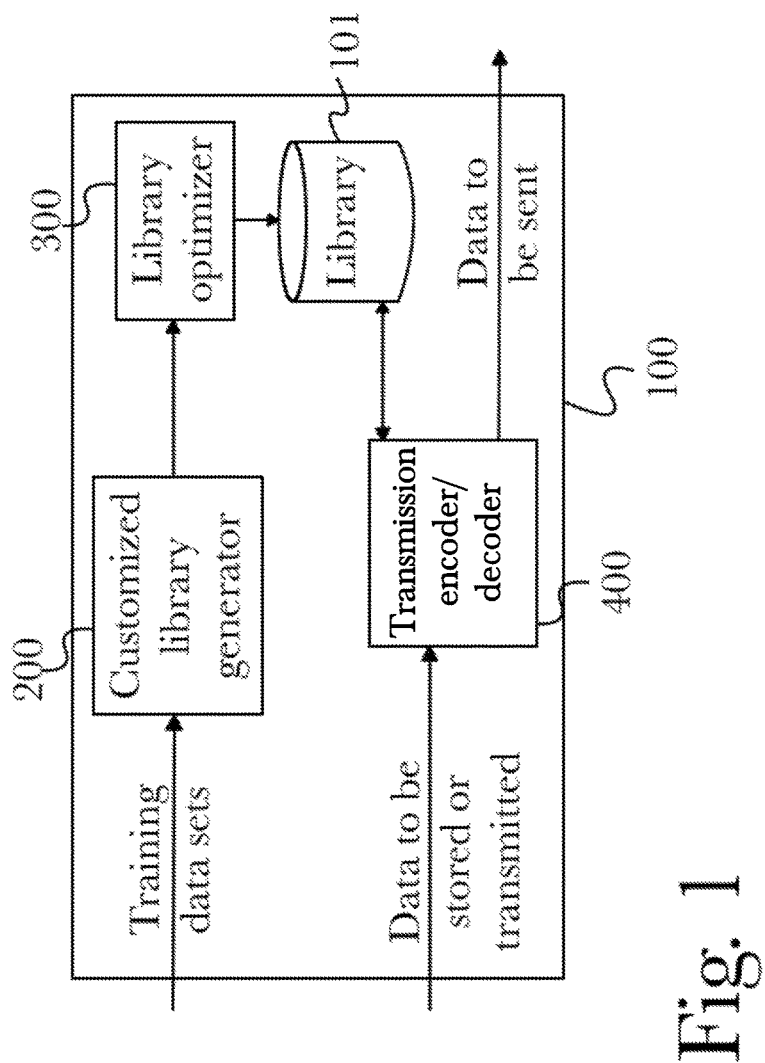
FIG. 1 is a diagram showing an exemplary system architecture, according to a preferred embodiment of the invention.

The inventor has conceived, and reduced to practice, a system and method for high-speed transfer of small data sets, that provides near-instantaneous bit-level lossless compression, that is ideal for communications environments that cannot tolerate even small amounts of data corruption, have very low latency tolerance, where data has a low entropy rate, and where every bit costs the user bandwidth, power, or time so that compression is worthwhile.

One or more different aspects may be described in the present application. Further, for one or more of the aspects described herein, numerous alternative arrangements may be described; it should be appreciated that these are presented for illustrative purposes only and are not limiting of the aspects contained herein or the claims presented herein in any way. One or more of the arrangements may be widely applicable to numerous aspects, as may be readily apparent from the disclosure. In general, arrangements are described in sufficient detail to enable those skilled in the art to practice one or more of the aspects, and it should be appreciated that other arrangements may be utilized and that structural, logical, software, electrical and other changes may be made without departing from the scope of the particular aspects. Particular features of one or more of the aspects described herein may be described with reference to one or more particular aspects or figures that form a part of the present disclosure, and in which are shown, by way of illustration, specific arrangements of one or more of the aspects. It should be appreciated, however, that such features are not limited to usage in the one or more particular aspects or figures with reference to which they are described. The present disclosure is neither a literal description of all arrangements of one or more of the aspects nor a listing of features of one or more of the aspects that must be present in all arrangements.

Headings of sections provided in this patent application and the title of this patent application are for convenience only, and are not to be taken as limiting the disclosure in any way.

Devices that are in communication with each other need not be in continuous communication with each other, unless expressly specified otherwise. In addition, devices that are in communication with each other may communicate directly or indirectly through one or more communication means or intermediaries, logical or physical.

A description of an aspect with several components in communication with each other does not imply that all such components are required. To the contrary, a variety of optional components may be described to illustrate a wide variety of possible aspects and in order to more fully illustrate one or more aspects. Similarly, although process steps, method steps, algorithms or the like may be described in a sequential order, such processes, methods and algorithms may generally be configured to work in alternate orders, unless specifically stated to the contrary. In other words, any sequence or order of steps that may be described in this patent application does not, in and of itself, indicate a requirement that the steps be performed in that order. The steps of described processes may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to one or more of the aspects, and does not imply that the illustrated process is preferred. Also, steps are generally described once per aspect, but this does not mean they must occur once, or that they may only occur once each time a process, method, or algorithm is carried out or executed. Some steps may be omitted in some aspects or some occurrences, or some steps may be executed more than once in a given aspect or occurrence.

When a single device or article is described herein, it will be readily apparent that more than one device or article may be used in place of a single device or article. Similarly, where more than one device or article is described herein, it will be readily apparent that a single device or article may be used in place of the more than one device or article.

The functionality or the features of a device may be alternatively embodied by one or more other devices that are not explicitly described as having such functionality or features. Thus, other aspects need not include the device itself.

Techniques and mechanisms described or referenced herein will sometimes be described in singular form for clarity. However, it should be appreciated that particular aspects may include multiple iterations of a technique or multiple instantiations of a mechanism unless noted otherwise. Process descriptions or blocks in figures should be understood as representing modules, segments, or portions of code which include one or more executable instructions for implementing specific logical functions or steps in the process. Alternate implementations are included within the scope of various aspects in which, for example, functions may be executed out of order from that shown or discussed, including substantially concurrently or in reverse order, depending on the functionality involved, as would be understood by those having ordinary skill in the art.

Definitions

The term "bit" refers to the smallest unit of information that can be stored or transmitted. It is in the form of a binary digit (either 0 or 1). In terms of hardware, the bit is represented as an electrical signal that is either off (representing 0) or on (representing 1).

The term "byte" refers to a series of bits exactly eight bits in length.

The terms "compression" and "deflation" as used herein mean the representation of data in a more compact form than the original dataset. Compression and/or deflation may be either "lossless", in which the data can be reconstructed in its original form without any loss of the original data, or "lossy" in which the data can be reconstructed in its original form, but with some loss of the original data.

The terms "compression ratio", "compression factor", "deflation ratio", and "deflation factor" as used herein all mean the size of the original data relative to the size of the compressed data.

The term "data" means information in any computer-readable form.

A "database" or "data storage subsystem" (these terms may be considered substantially synonymous), as used herein, is a system adapted for the long-term storage, indexing, and retrieval of data, the retrieval typically being via some sort of querying interface or language. "Database" may be used to refer to relational database management systems known in the art, but should not be considered to be limited to such systems. Many alternative database or data storage system technologies have been, and indeed are being, introduced in the art, including but not limited to distributed non-relational data storage systems such as Hadoop, column-oriented databases, in-memory databases, and the like. While various aspects may preferentially employ one or another of the various data storage subsystems available in the art (or available in the future), the invention should not be construed to be so limited, as any data storage architecture may be used according to the aspects. Similarly, while in some cases one or more particular data storage needs are described as being satisfied by separate components (for example, an expanded private capital markets database and a configuration database), these descriptions refer to functional uses of data storage systems and do not refer to their physical architecture. For instance, any group of data storage systems of databases referred to herein may be included together in a single database management system operating on a single machine, or they may be included in a single database management system operating on a cluster of machines as is known in the art. Similarly, any single database (such as an expanded private capital markets database) may be implemented on a single machine, on a set of machines using clustering technology, on several machines connected by one or more messaging systems known in the art, or in a master/slave arrangement common in the art. These examples should make clear that no particular architectural approaches to database management is preferred according to the invention, and choice of data storage technology is at the discretion of each implementer, without departing from the scope of the invention as claimed.

The term "dataset" or "data set" refers to a grouping of data for a particular purpose. One example of a data set might be a word processing file containing text and formatting information.

Conceptual Architecture

FIG. 1 is a diagram showing an exemplary system architecture 100, according to a preferred embodiment of the invention. Incoming training data sets may be received at a customized library generator 200 that processes training data to produce a customized word library 101 comprising key-value pairs of data words (each comprising a string of bits) and their corresponding calculated binary Huffman codewords. The resultant word library 101 may then be processed by a library optimizer 300 to reduce size and improve efficiency, for example by pruning low-occurrence data entries or calculating approximate codewords that may be used to match more than one data word. A transmission encoder/decoder 400 may be used to receive incoming data intended for storage or transmission, process the data using a word library 101 to retrieve codewords for the words in the incoming data, and then append the codewords (rather than the original data) to an outbound data stream. Each of these components is described in greater detail below, illustrating the particulars of their respective processing and other functions, referring to FIGS. 2-4.

System 100 provides near-instantaneous source coding that is dictionary-based and learned in advance from sample training data, so that encoding and decoding may happen concurrently with data transmission. This results in computational latency that is near zero but the data size reduction is comparable to classical compression. For example, if N bits are to be transmitted from sender to receiver, the compression ratio of classical compression is C the ratio between the deflation factor of system 100 and that of multi-pass source coding is p, the classical compression encoding rate is $R_C$ bit/s and the decoding rate is $R_D$ bit/s, and the transmission speed is S bit/s, the compress-send-decompress time will be $$T_{old} = \frac{N}{R_C} + \frac{N}{CS} + \frac{N}{CR_D}$$

while the transmit-while-coding time for system 100 will be (assuming that encoding and decoding happen at least as quickly as network latency):

$$T_{new} = \frac{Np}{CS} \text{ so}$$

that the total data transit time improvement factor is $$\frac{T_{old}}{T_{new}} = \frac{\frac{CS}{R_C} + 1 + \frac{S}{R_D}}{p}$$

which presents a savings whenever $$\frac{CS}{R_C} + \frac{S}{R_D} > p - 1.$$

This is a reasonable scenario given that typical values in real-world practice are C=0.32, $R_C$=1.1·10$^{12}$, $R_D$=4.2·10$^{12}$, S=10$^{11}$, giving $$\frac{CS}{R_C} + \frac{S}{R_D} = 0.053 \ldots,$$

such that system 100 will outperform the total transit time of the best compression technology available as long as its deflation factor is no more than 5% worse than compression. Such customized dictionary-based encoding will also sometimes exceed the deflation ratio of classical compression, particularly when network speeds increase beyond 100 Gb/s.

The delay between data creation and its readiness for use at a receiving end will be equal to only the source word length t (typically 5-15 bytes), divided by the deflation factor C/p and the network speed S, i.e.

$$delay_{invention} = \frac{tp}{CS}$$

since encoding and decoding occur concurrently with data transmission. On the other hand, the latency associated with classical compression is $$delay_{priorart} = \frac{N}{R_C} + \frac{N}{CS} + \frac{N}{CR_D}$$

where N is the packet/file size. Even with the generous values chosen above as well as N=512K, t=10, and p=1.05, this results in $delay_{invention} \approx 3.3 \cdot 10^{-10}$ while $delay_{priorart} \approx 1.3 \cdot 10^{-7}$, a more than 400-fold reduction in latency.

A key factor in the efficiency of Huffman coding used by system 100 is that key-value pairs be chosen carefully to minimize expected coding length, so that the average deflation/compression ratio is minimized. It is possible to achieve the best possible expected code length among all instantaneous codes using Huffman codes if one has access to the exact probability distribution of source words of a given desired length from the random variable generating them. In practice this is impossible, as data is received in a wide variety of formats and the random processes underlying the source data are a mixture of human input, unpredictable (though in principle, deterministic) physical events, and noise. System 100 addresses this by restriction of data types and density estimation; training data is provided that is representative of the type of data anticipated in "real-world" use of system 100, which is then used to model the distribution of binary strings in the data in order to build a Huffman code word library 100.

Figure 2:
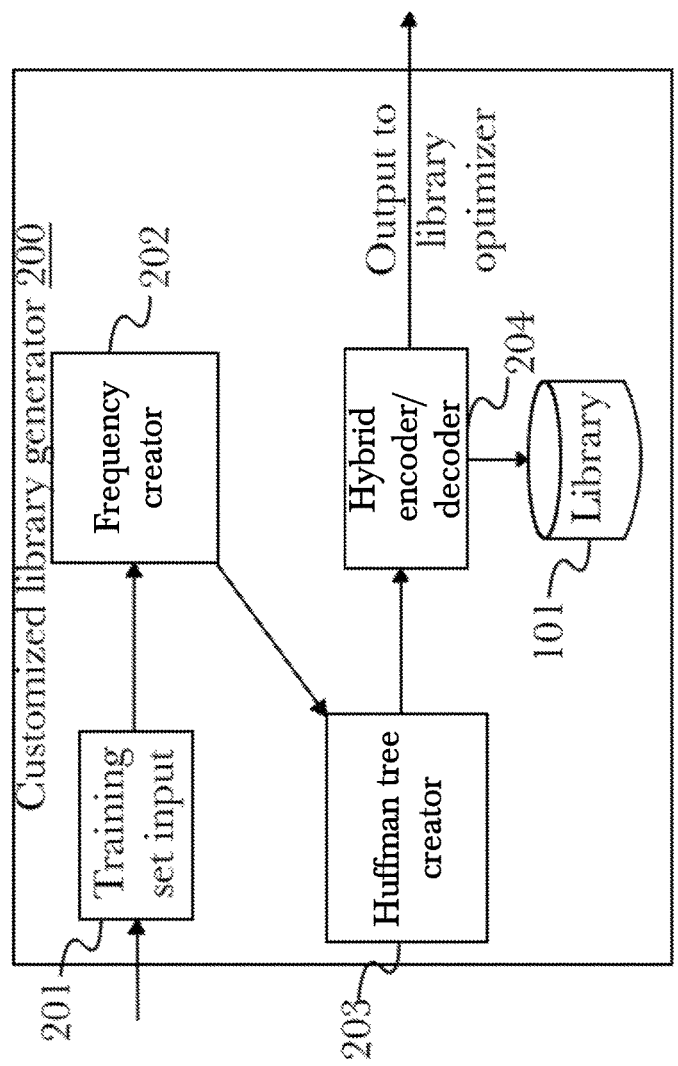
FIG. 2 is a diagram showing a more detailed architecture for a customized library generator.

FIG. 2 is a diagram showing a more detailed architecture for a customized library generator 200. When an incoming training data set 201 is received, it may be analyzed using a frequency creator 202 to analyze for word frequency (that is, the frequency with which a given word occurs in the training data set). Word frequency may be analyzed by scanning all substrings of bits and directly calculating the frequency of each substring by iterating over the data set to produce an occurrence frequency, which may then be used to estimate the rate of word occurrence in non-training data. A first Huffman binary tree is created based on the frequency of occurrences of each word in the first dataset, and a Huffman codeword is assigned to each observed word in the first dataset according to the first Huffman binary tree. Machine learning may be utilized to improve results by processing a number of training data sets and using the results of each training set to refine the frequency estimations for non-training data, so that the estimation yield better results when used with real-world data (rather than, for example, being only based on a single training data set that may not be very similar to a received non-training data set). A second Huffman tree creator 203 may be utilized to identify words that do not match any existing entries in a word library 101 and pass them to a hybrid encoder/decoder 204, that then calculates a binary Huffman codeword for the mismatched word and adds the codeword and original data to the word library 101 as a new key-value pair. In this manner, customized library generator 200 may be used both to establish an initial word library 101 from a first training set, as well as expand the word library 101 using additional training data to improve operation.

Figure 3:
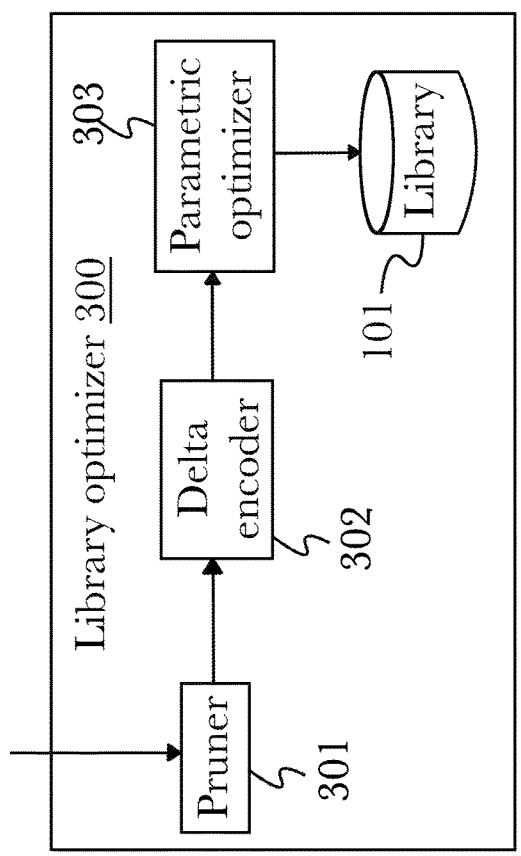
FIG. 3 is a diagram showing a more detailed architecture for a library optimizer.

FIG. 3 is a diagram showing a more detailed architecture for a library optimizer 300. A pruner 301 may be used to load a word library 101 and reduce its size for efficient operation, for example by sorting the word library 101 based on the known occurrence probability of each key-value pair and removing low-probability key-value pairs based on a loaded threshold parameter. This prunes low-value data from the word library to trim the size, eliminating large quantities of very-low-frequency key-value pairs such as single-occurrence words that are unlikely to be encountered again in a data set. Pruning eliminates the least-probable entries from word library 101 up to a given threshold, which will have a negligible impact on the deflation factor since the removed entries are only the least-common ones, while the impact on word library size will be larger because samples drawn from asymptotically normal distributions (such as the log-probabilities of words generated by a probabilistic finite state machine, a model well-suited to a wide variety of real-world data) which occur in tails of the distribution are disproportionately large in counting measure. A delta encoder 302 may be utilized to apply delta encoding to a plurality of words to store an approximate codeword as a value in the word library, for which each of the plurality of source words is a valid corresponding key. This may be used to reduce library size by replacing numerous key-value pairs with a single entry for the approximate codeword and then represent actual codewords using the approximate codeword plus a delta value representing the difference between the approximate codeword and the actual codeword. Approximate coding is optimized for low-weight sources such as Golomb coding, run-length coding, and similar techniques. The approximate source words may be chosen by locality-sensitive hashing, so as to approximate Hamming distance without incurring the intractability of nearest-neighbor-search in Hamming space. A parametric optimizer 303 may load configuration parameters for operation to optimize the use of the word library 101 during operation. Best-practice parameter/hyperparameter optimization strategies such as stochastic gradient descent, quasi-random grid search, and evolutionary search may be used to make optimal choices for all interdependent settings playing a role in the functionality of system 100. In cases where lossless compression is not required, the delta value may be discarded at the expense of introducing some limited errors into any decoded (reconstructed) data.

Figure 4:
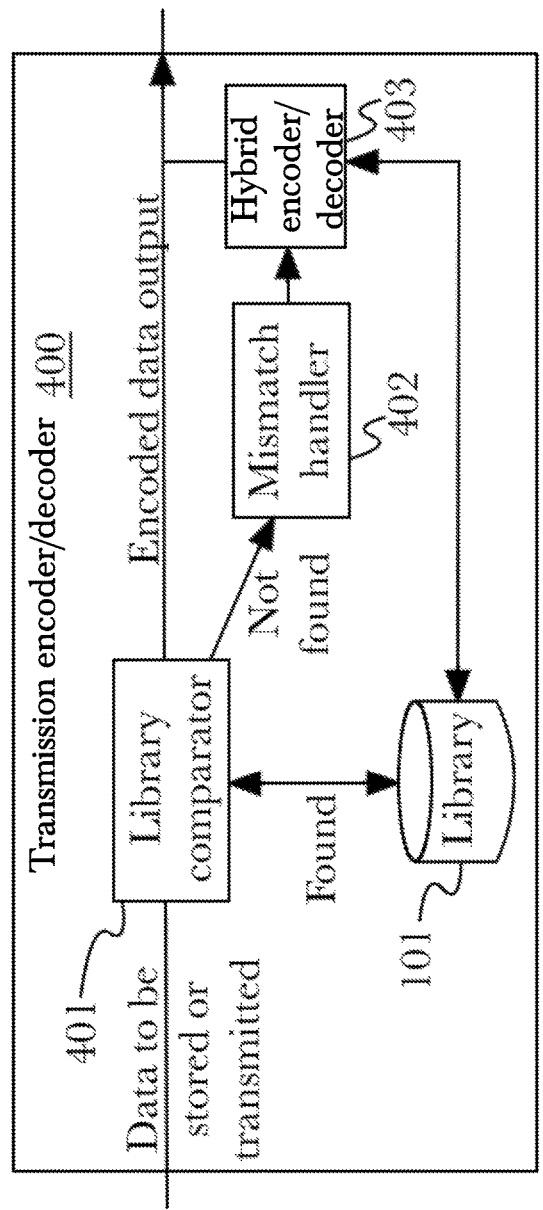
FIG. 4 is a diagram showing a more detailed architecture for a transmission and storage engine.

FIG. 4 is a diagram showing a more detailed architecture for a transmission encoder/decoder 400. According to various arrangements, transmission encoder/decoder 400 may be used to deconstruct data for storage or transmission, or to reconstruct data that has been received, using a word library 101. A library comparator 401 may be used to receive data comprising words or codewords, and compare against a word library 101 by dividing the incoming stream into substrings of length t and using a fast hash to check word library 101 for each substring. If a substring is found in word library 101, the corresponding key/value (that is, the corresponding source word or codeword, according to whether the substring used in comparison was itself a word or codeword) is returned and appended to an output stream. If a given substring is not found in word library 101, a mismatch handler 402 and hybrid encoder/decoder 403 may be used to handle the mismatch similarly to operation during the construction or expansion of word library 101. A mismatch handler 402 may be utilized to identify words that do not match any existing entries in a word library 101 and pass them to a hybrid encoder/decoder 403, that then calculates a binary Huffman codeword for the mismatched word and adds the codeword and original data to the word library 101 as a new key-value pair. The newly-produced codeword may then be appended to the output stream. In arrangements where a mismatch indicator is included in a received data stream, this may be used to preemptively identify a substring that is not in word library 101 (for example, if it was identified as a mismatch on the transmission end), and handled accordingly without the need for a library lookup.

Description of Method Aspects

Figure 5:
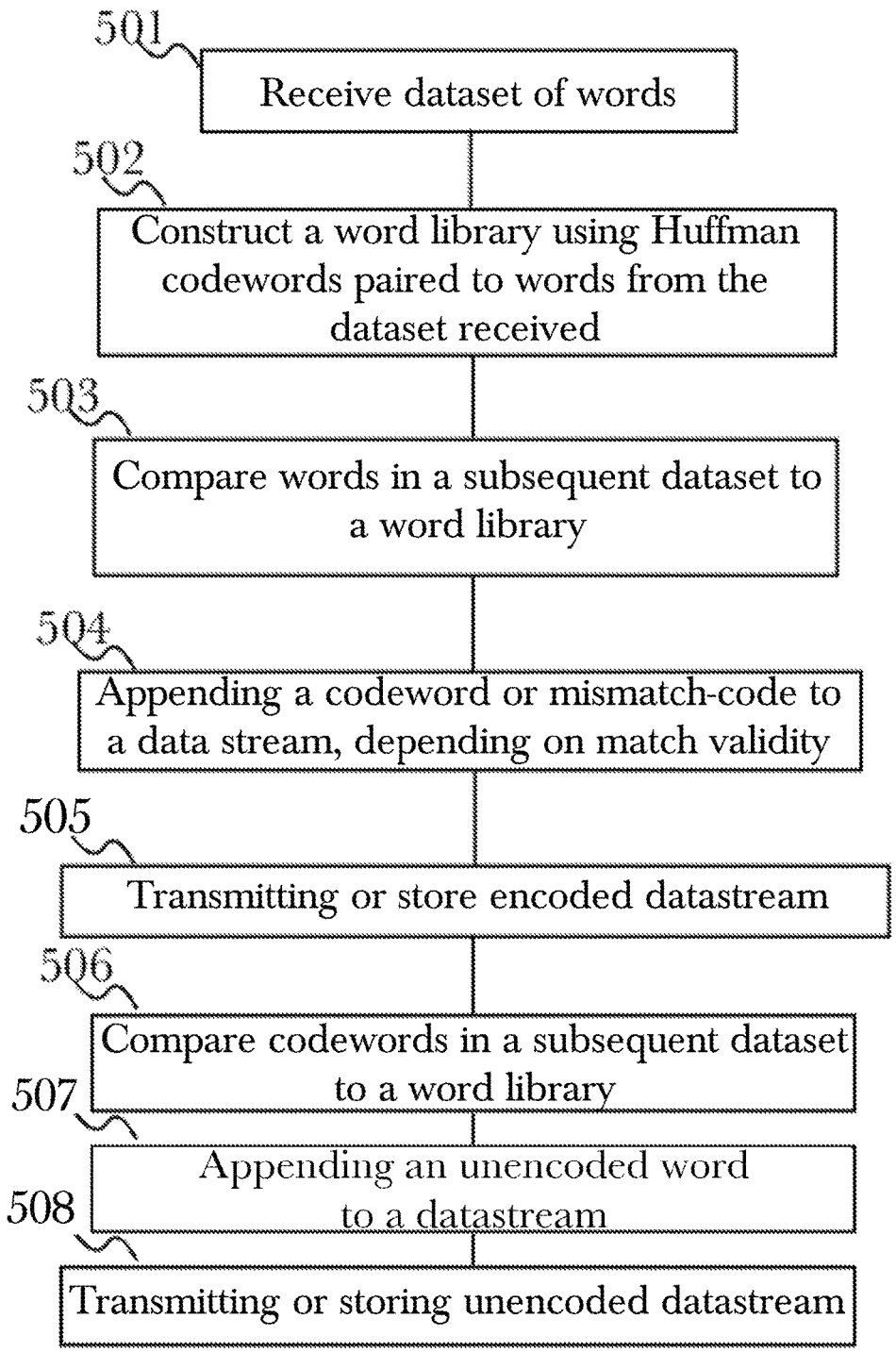
FIG. 5 is a method diagram illustrating key system functionality utilizing an encoder and decoder pair, according to a preferred embodiment.

FIG. 5 is a method diagram illustrating key system functionality utilizing an encoder and decoder pair, according to a preferred embodiment. In a first step 501, at least one incoming data set may be received at a customized library generator 200 that then 502 processes data to produce a customized word library 101 comprising key-value pairs of data words (each comprising a string of bits) and their corresponding calculated binary Huffman codewords. A subsequent dataset may be received, and compared to the word library 503 to determine the proper codewords to use in order to encode the dataset. Words in the dataset are checked against the word library and appropriate encodings are appended to a data stream 504. If a word is mismatched within the word library and the dataset, meaning that it is present in the dataset but not the word library, then a mismatched code is appended, followed by the unencoded original word. If a word has a match within the word library, then the appropriate codeword in the word library is appended to the data stream. Such a data stream may then be stored or transmitted 505 to a destination as desired. For the purposes of decoding, an already-encoded data stream may be received and compared 506, and un-encoded words may be appended to a new data stream 507 depending on word matches found between the encoded data stream and the word library that is present. A matching codeword that is found in a word library is replaced with the matching word and appended to a data stream, and a mismatch code found in a data stream is deleted and the following unencoded word is re-appended to a new data stream, the inverse of the process of encoding described earlier. Such a data stream may then be stored or transmitted 508 as desired.

Figure 6:
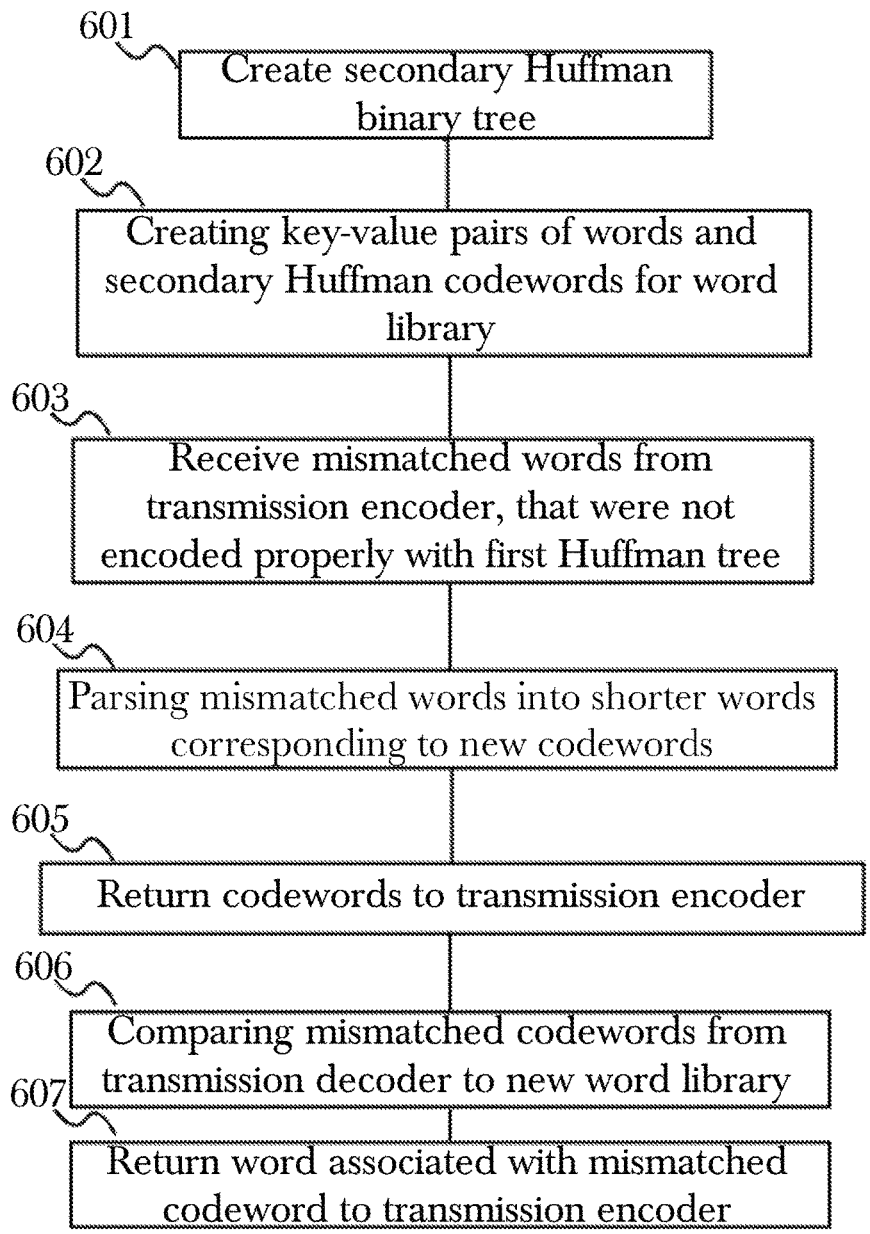
FIG. 6 is a method diagram illustrating possible use of a hybrid encoder/decoder to improve the compression ratio, according to a preferred aspect.

FIG. 6 is a method diagram illustrating possible use of a hybrid encoder/decoder to improve the compression ratio, according to a preferred aspect. A second Huffman binary tree may be created 601, having a shorter maximum length of codewords than a first Huffman binary tree 502, allowing a word library to be filled with every combination of codeword possible in this shorter Huffman binary tree 602. A word library may be filled with these Huffman codewords and words from a dataset 602, such that a hybrid encoder/decoder 204, 403 may receive any mismatched words from a dataset for which encoding has been attempted with a first Huffman binary tree 603, 504 and parse previously mismatched words into new partial codewords (that is, codewords that are each a substring of an original mismatched codeword) using the second Huffman binary tree 604. In this way, an incomplete word library may be supplemented by a second word library. New codewords attained in this way may then be returned to a transmission encoder 605, 400. In the event that an encoded dataset is received for decoding, and there is a mismatch code indicating that additional coding is needed, a mismatch code may be removed and the unencoded word used to generate a new codeword as before 606, so that a transmission encoder 400 may have the word and newly generated codeword added to its word library 607, to prevent further mismatching and errors in encoding and decoding.

Hardware Architecture

Generally, the techniques disclosed herein may be implemented on hardware or a combination of software and hardware. For example, they may be implemented in an operating system kernel, in a separate user process, in a library package bound into network applications, on a specially constructed machine, on an application-specific integrated circuit (ASIC), or on a network interface card.

Software/hardware hybrid implementations of at least some of the aspects disclosed herein may be implemented on a programmable network-resident machine (which should be understood to include intermittently connected network-aware machines) selectively activated or reconfigured by a computer program stored in memory. Such network devices may have multiple network interfaces that may be configured or designed to utilize different types of network communication protocols. A general architecture for some of these machines may be described herein in order to illustrate one or more exemplary means by which a given unit of functionality may be implemented. According to specific aspects, at least some of the features or functionalities of the various aspects disclosed herein may be implemented on one or more general-purpose computers associated with one or more networks, such as for example an end-user computer system, a client computer, a network server or other server system, a mobile computing device (e.g., tablet computing device, mobile phone, smartphone, laptop, or other appropriate computing device), a consumer electronic device, a music player, or any other suitable electronic device, router, switch, or other suitable device, or any combination thereof. In at least some aspects, at least some of the features or functionalities of the various aspects disclosed herein may be implemented in one or more virtualized computing environments (e.g., network computing clouds, virtual machines hosted on one or more physical computing machines, or other appropriate virtual environments).

Figure 7:
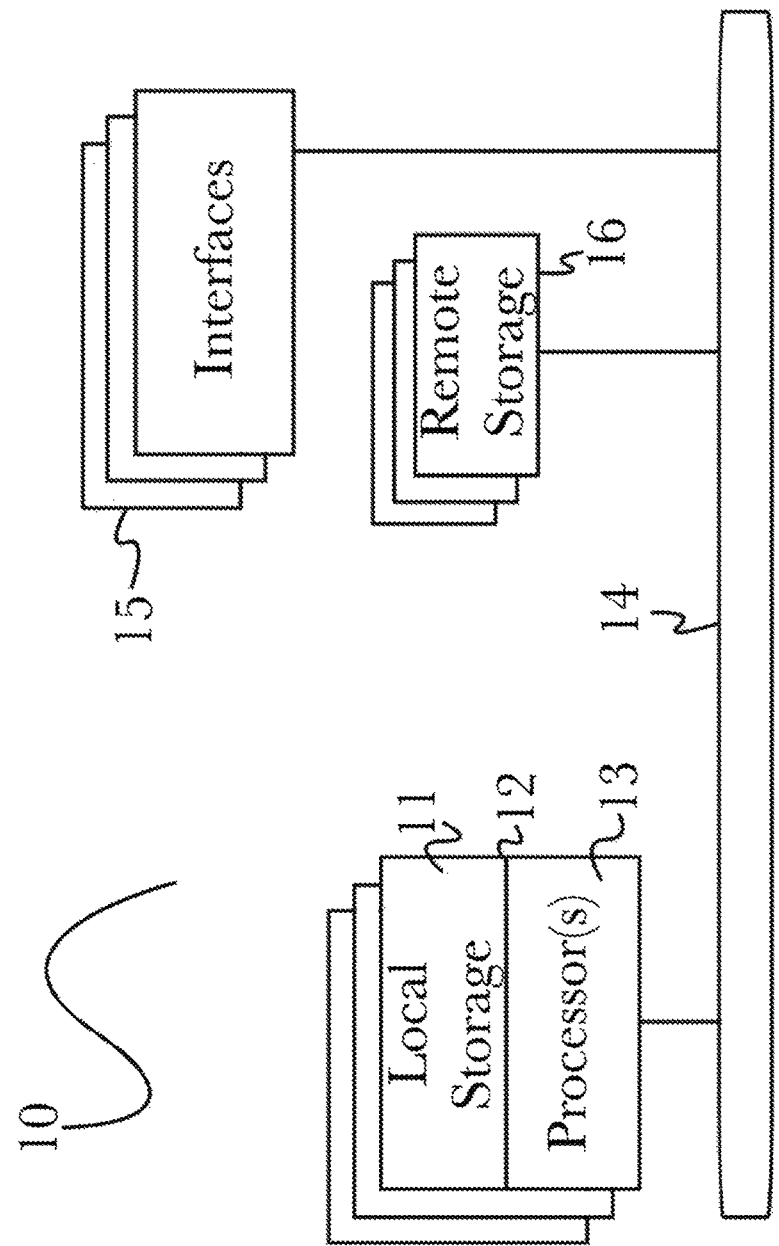
FIG. 7 is a block diagram illustrating an exemplary hardware architecture of a computing device.

Referring now to FIG. 7, there is shown a block diagram depicting an exemplary computing device 10 suitable for implementing at least a portion of the features or functionalities disclosed herein. Computing device 10 may be, for example, any one of the computing machines listed in the previous paragraph, or indeed any other electronic device capable of executing software- or hardware-based instructions according to one or more programs stored in memory. Computing device 10 may be configured to communicate with a plurality of other computing devices, such as clients or servers, over communications networks such as a wide area network a metropolitan area network, a local area network, a wireless network, the Internet, or any other network, using known protocols for such communication, whether wireless or wired.

In one aspect, computing device 10 includes one or more central processing units (CPU) 12, one or more interfaces 15, and one or more busses 14 (such as a peripheral component interconnect (PCI) bus). When acting under the control of appropriate software or firmware, CPU 12 may be responsible for implementing specific functions associated with the functions of a specifically configured computing device or machine. For example, in at least one aspect, a computing device 10 may be configured or designed to function as a server system utilizing CPU 12, local memory 11 and/or remote memory 16, and interface(s) 15. In at least one aspect, CPU 12 may be caused to perform one or more of the different types of functions and/or operations under the control of software modules or components, which for example, may include an operating system and any appropriate applications software, drivers, and the like.

CPU 12 may include one or more processors 13 such as, for example, a processor from one of the Intel, ARM, Qualcomm, and AMD families of microprocessors. In some aspects, processors 13 may include specially designed hardware such as application-specific integrated circuits (ASICs), electrically erasable programmable read-only memories (EEPROMs), field-programmable gate arrays (FPGAs), and so forth, for controlling operations of computing device 10. In a particular aspect, a local memory 11 (such as non-volatile random access memory (RAM) and/or read-only memory (ROM), including for example one or more levels of cached memory) may also form part of CPU 12. However, there are many different ways in which memory may be coupled to system 10. Memory 11 may be used for a variety of purposes such as, for example, caching and/or storing data, programming instructions, and the like. It should be further appreciated that CPU 12 may be one of a variety of system-on-a-chip (SOC) type hardware that may include additional hardware such as memory or graphics processing chips, such as a QUALCOMM SNAPDRAGON™ or SAMSUNG EXYNOS™ CPU as are becoming increasingly common in the art, such as for use in mobile devices or integrated devices.

As used herein, the term "processor" is not limited merely to those integrated circuits referred to in the art as a processor, a mobile processor, or a microprocessor, but broadly refers to a microcontroller, a microcomputer, a programmable logic controller, an application-specific integrated circuit, and any other programmable circuit.

In one aspect, interfaces 15 are provided as network interface cards (NICs). Generally, NICs control the sending and receiving of data packets over a computer network; other types of interfaces 15 may for example support other peripherals used with computing device 10. Among the interfaces that may be provided are Ethernet interfaces, frame relay interfaces, cable interfaces, DSL interfaces, token ring interfaces, graphics interfaces, and the like. In addition, various types of interfaces may be provided such as, for example, universal serial bus (USB), Serial, Ethernet, FIREWIRE™, THUNDERBOLT™, PCI, parallel, radio frequency (RF), BLUETOOTH™, near-field communications (e.g., using near-field magnetics), 802.11 (Wi-Fi), frame relay, TCP/IP, ISDN, fast Ethernet interfaces, Gigabit Ethernet interfaces, Serial ATA (SATA) or external SATA (ESATA) interfaces, high-definition multimedia interface (HDMI), digital visual interface (DVI), analog or digital audio interfaces, asynchronous transfer mode (ATM) interfaces, high-speed serial interface (HSSI) interfaces, Point of Sale (POS) interfaces, fiber data distributed interfaces (FDDIs), and the like. Generally, such interfaces 15 may include physical ports appropriate for communication with appropriate media. In some cases, they may also include an independent processor (such as a dedicated audio or video processor, as is common in the art for high-fidelity AN hardware interfaces) and, in some instances, volatile and/or non-volatile memory (e.g., RAM).

Although the system shown in FIG. 7 illustrates one specific architecture for a computing device 10 for implementing one or more of the aspects described herein, it is by no means the only device architecture on which at least a portion of the features and techniques described herein may be implemented. For example, architectures having one or any number of processors 13 may be used, and such processors 13 may be present in a single device or distributed among any number of devices. In one aspect, a single processor 13 handles communications as well as routing computations, while in other aspects a separate dedicated communications processor may be provided. In various aspects, different types of features or functionalities may be implemented in a system according to the aspect that includes a client device (such as a tablet device or smartphone running client software) and server systems (such as a server system described in more detail below).

Regardless of network device configuration, the system of an aspect may employ one or more memories or memory modules (such as, for example, remote memory block 16 and local memory 11) configured to store data, program instructions for the general-purpose network operations, or other information relating to the functionality of the aspects described herein (or any combinations of the above). Program instructions may control execution of or comprise an operating system and/or one or more applications, for example. Memory 16 or memories 11, 16 may also be configured to store data structures, configuration data, encryption data, historical system operations information, or any other specific or generic non-program information described herein.

Because such information and program instructions may be employed to implement one or more systems or methods described herein, at least some network device aspects may include nontransitory machine-readable storage media, which, for example, may be configured or designed to store program instructions, state information, and the like for performing various operations described herein. Examples of such nontransitory machine-readable storage media include, but are not limited to, magnetic media such as hard disks, floppy disks, and magnetic tape; optical media such as CD-ROM disks; magneto-optical media such as optical disks, and hardware devices that are specially configured to store and perform program instructions, such as read-only memory devices (ROM), flash memory (as is common in mobile devices and integrated systems), solid state drives (SSD) and "hybrid SSD" storage drives that may combine physical components of solid state and hard disk drives in a single hardware device (as are becoming increasingly common in the art with regard to personal computers), memristor memory, random access memory (RAM), and the like. It should be appreciated that such storage means may be integral and non-removable (such as RAM hardware modules that may be soldered onto a motherboard or otherwise integrated into an electronic device), or they may be removable such as swappable flash memory modules (such as "thumb drives" or other removable media designed for rapidly exchanging physical storage devices), "hot-swappable" hard disk drives or solid state drives, removable optical storage discs, or other such removable media, and that such integral and removable storage media may be utilized interchangeably. Examples of program instructions include both object code, such as may be produced by a compiler, machine code, such as may be produced by an assembler or a linker, byte code, such as may be generated by for example a JAVA™ compiler and may be executed using a Java virtual machine or equivalent, or files containing higher level code that may be executed by the computer using an interpreter (for example, scripts written in Python, Perl, Ruby, Groovy, or any other scripting language).

Figure 8:
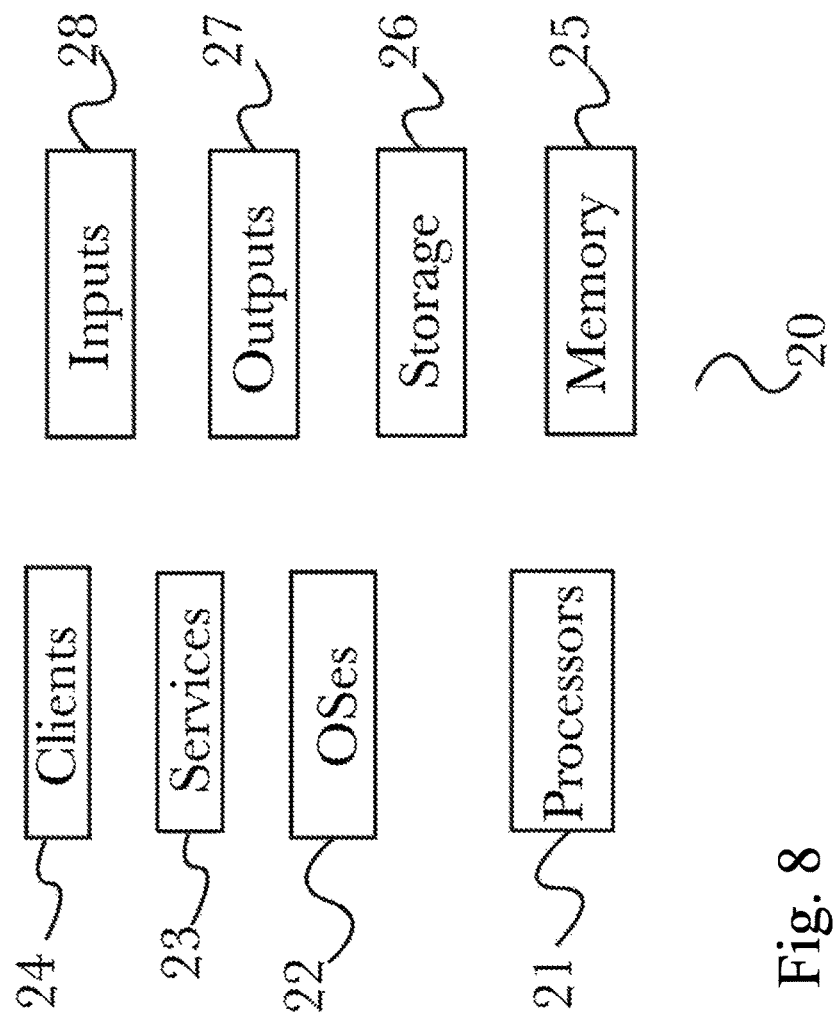
FIG. 8 is a block diagram illustrating an exemplary logical architecture for a client device.

In some aspects, systems may be implemented on a standalone computing system. Referring now to FIG. 8, there is shown a block diagram depicting a typical exemplary architecture of one or more aspects or components thereof on a standalone computing system. Computing device 20 includes processors 21 that may run software that carry out one or more functions or applications of aspects, such as for example a client application 24. Processors 21 may carry out computing instructions under control of an operating system 22 such as, for example, a version of MICROSOFT WINDOWS™ operating system, APPLE macOS™ or iOS™ operating systems, some variety of the Linux operating system, ANDROID™ operating system, or the like. In many cases, one or more shared services 23 may be operable in system 20, and may be useful for providing common services to client applications 24. Services 23 may for example be WINDOWS™ services, user-space common services in a Linux environment, or any other type of common service architecture used with operating system 21. Input devices 28 may be of any type suitable for receiving user input, including for example a keyboard, touchscreen, microphone (for example, for voice input), mouse, touchpad, trackball, or any combination thereof. Output devices 27 may be of any type suitable for providing output to one or more users, whether remote or local to system 20, and may include for example one or more screens for visual output, speakers, printers, or any combination thereof. Memory 25 may be random-access memory having any structure and architecture known in the art, for use by processors 21, for example to run software. Storage devices 26 may be any magnetic, optical, mechanical, memristor, or electrical storage device for storage of data in digital form (such as those described above, referring to FIG. 7). Examples of storage devices 26 include flash memory, magnetic hard drive, CD-ROM, and/or the like.

Figure 9:
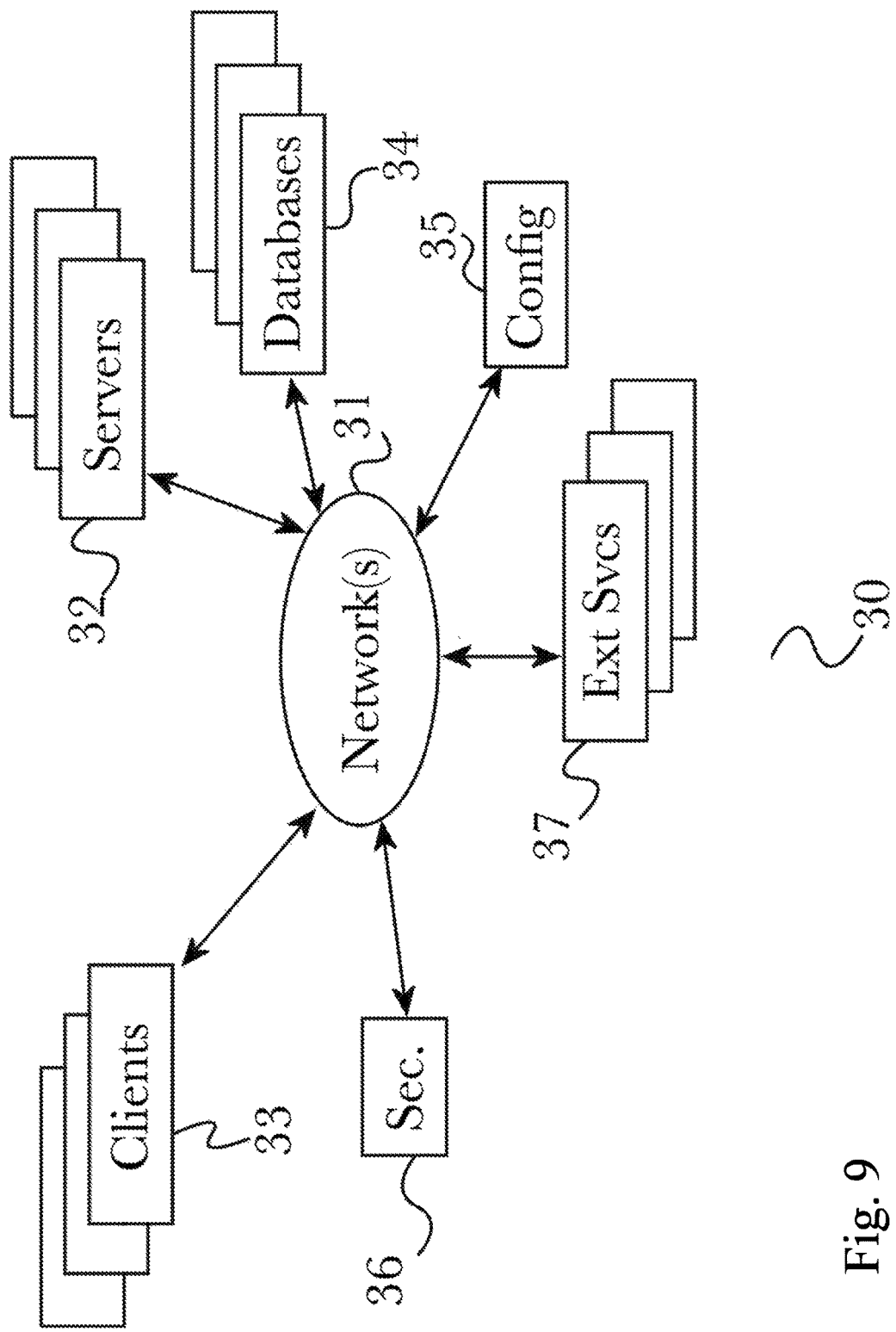
FIG. 9 is a block diagram showing an exemplary architectural arrangement of clients, servers, and external services.

In some aspects, systems may be implemented on a distributed computing network, such as one having any number of clients and/or servers. Referring now to FIG. 9, there is shown a block diagram depicting an exemplary architecture 30 for implementing at least a portion of a system according to one aspect on a distributed computing network. According to the aspect, any number of clients 33 may be provided. Each client 33 may run software for implementing client-side portions of a system; clients may comprise a system 20 such as that illustrated in FIG. 8. In addition, any number of servers 32 may be provided for handling requests received from one or more clients 33. Clients 33 and servers 32 may communicate with one another via one or more electronic networks 31, which may be in various aspects any of the Internet, a wide area network, a mobile telephony network (such as CDMA or GSM cellular networks), a wireless network (such as Wi-Fi, WiMAX, LTE, and so forth), or a local area network (or indeed any network topology known in the art; the aspect does not prefer any one network topology over any other).

Networks 31 may be implemented using any known network protocols, including for example wired and/or wireless protocols.

In addition, in some aspects, servers 32 may call external services 37 when needed to obtain additional information, or to refer to additional data concerning a particular call. Communications with external services 37 may take place, for example, via one or more networks 31. In various aspects, external services 37 may comprise web-enabled services or functionality related to or installed on the hardware device itself. For example, in one aspect where client applications 24 are implemented on a smartphone or other electronic device, client applications 24 may obtain information stored in a server system 32 in the cloud or on an external service 37 deployed on one or more of a particular enterprise's or user's premises.

In some aspects, clients 33 or servers 32 (or both) may make use of one or more specialized services or appliances that may be deployed locally or remotely across one or more networks 31. For example, one or more databases 34 may be used or referred to by one or more aspects. It should be understood by one having ordinary skill in the art that databases 34 may be arranged in a wide variety of architectures and using a wide variety of data access and manipulation means. For example, in various aspects one or more databases 34 may comprise a relational database system using a structured query language (SQL), while others may comprise an alternative data storage technology such as those referred to in the art as "NoSQL" (for example, HADOOP CASSANDRA™, GOOGLE BIGTABLE™, and so forth). In some aspects, variant database architectures such as column-oriented databases, in-memory databases, clustered databases, distributed databases, or even flat file data repositories may be used according to the aspect. It will be appreciated by one having ordinary skill in the art that any combination of known or future database technologies may be used as appropriate, unless a specific database technology or a specific arrangement of components is specified for a particular aspect described herein. Moreover, it should be appreciated that the term "database" as used herein may refer to a physical database machine, a cluster of machines acting as a single database system, or a logical database within an overall database management system. Unless a specific meaning is specified for a given use of the term "database", it should be construed to mean any of these senses of the word, all of which are understood as a plain meaning of the term "database" by those having ordinary skill in the art.

Similarly, some aspects may make use of one or more security systems 36 and configuration systems 35. Security and configuration management are common information technology (IT) and web functions, and some amount of each are generally associated with any IT or web systems. It should be understood by one having ordinary skill in the art that any configuration or security subsystems known in the art now or in the future may be used in conjunction with aspects without limitation, unless a specific security 36 or configuration system 35 or approach is specifically required by the description of any specific aspect.

Figure 10:
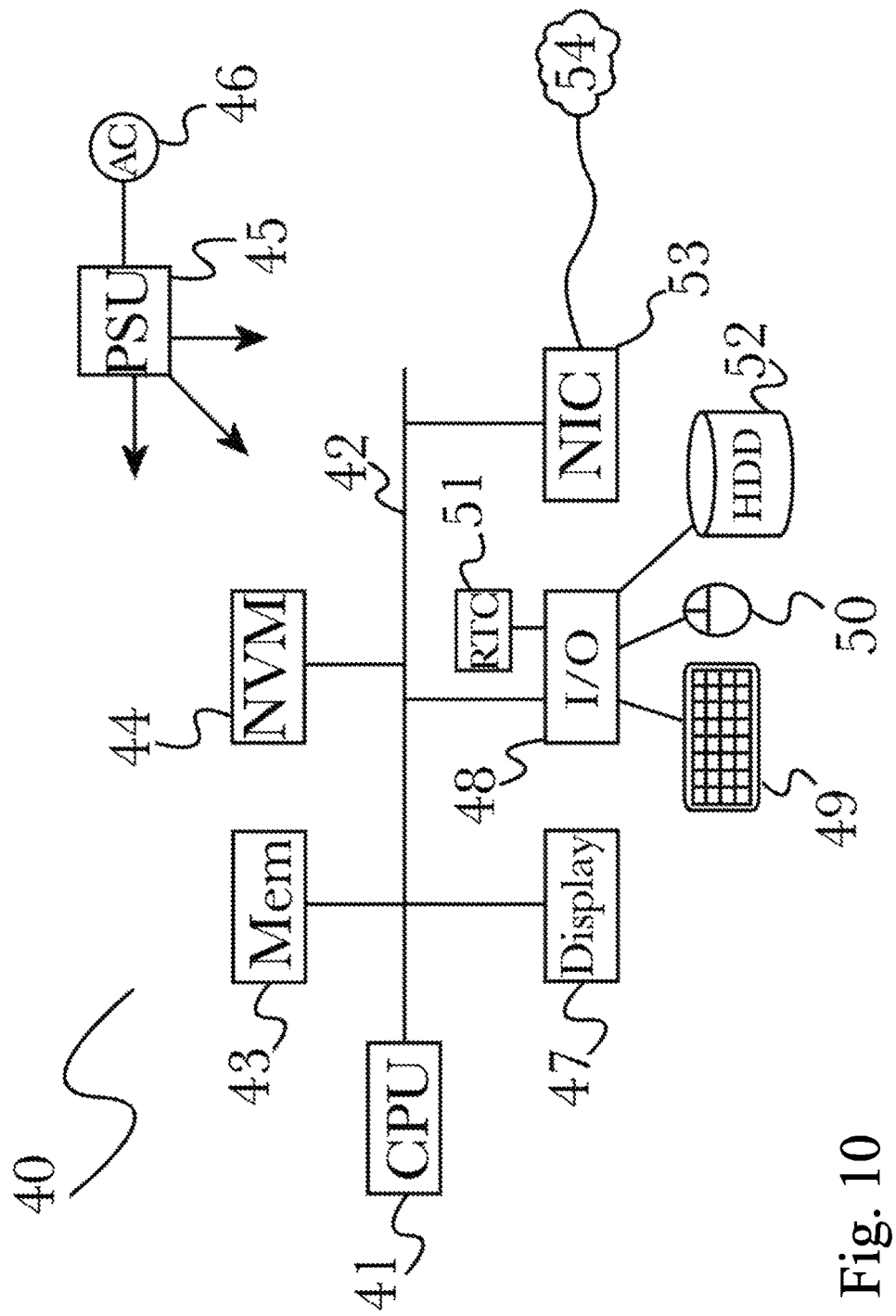
FIG. 10 is another block diagram illustrating an exemplary hardware architecture of a computing device.

FIG. 10 shows an exemplary overview of a computer system 40 as may be used in any of the various locations throughout the system. It is exemplary of any computer that may execute code to process data. Various modifications and changes may be made to computer system 40 without departing from the broader scope of the system and method disclosed herein. Central processor unit (CPU) 41 is connected to bus 42, to which bus is also connected memory 43, nonvolatile memory 44, display 47, input/output (I/O) unit 48, and network interface card (NIC) 53. I/O unit 48 may, typically, be connected to keyboard 49, pointing device 50, hard disk 52, and real-time clock 51. NIC 53 connects to network 54, which may be the Internet or a local network, which local network may or may not have connections to the Internet. Also shown as part of system 40 is power supply unit 45 connected, in this example, to a main alternating current (AC) supply 46. Not shown are batteries that could be present, and many other devices and modifications that are well known but are not applicable to the specific novel functions of the current system and method disclosed herein. It should be appreciated that some or all components illustrated may be combined, such as in various integrated applications, for example Qualcomm or Samsung system-on-a-chip (SOC) devices, or whenever it may be appropriate to combine multiple capabilities or functions into a single hardware device (for instance, in mobile devices such as smartphones, video game consoles, in-vehicle computer systems such as navigation or multimedia systems in automobiles, or other integrated hardware devices).

In various aspects, functionality for implementing systems or methods of various aspects may be distributed among any number of client and/or server components. For example, various software modules may be implemented for performing various functions in connection with the system of any particular aspect, and such modules may be variously implemented to run on server and/or client components.

In some embodiments, the system will comprise a pre-trained (i.e., dictionary-based) Huffman coder. Huffman coding is a source coding technique which is instantaneously decodable (i.e., source codewords are encoded one-by-one and independently of each other) and asymptotically optimal (i.e., as encoded word length grows, the rate of the code—corresponding to the deflation/compression ratio—approaches the entropy rate of the encoded random variable). It is therefore well-suited to data which must be encoded for immediate transmission. A binary Huffman codebook is a library of key-value pairs, where the keys are source words (binary strings observable in source data) and values are the binary codewords to which source words are translated during encoding. Upon decoding the codebook is used in reverse: codewords are observed in the encoded stream, and then translated back to the keys corresponding to these values. It is possible to determine the boundaries between codewords for the purposes of this look-up because Huffman codes are by construction prefix-free and therefore self-punctuating, i.e., a codeword being observed one bit at a time will not match a value in the library until the entire word is revealed, and when it does so, the word will match a unique value. In an aspect of some embodiments, a prefix library will be built in advance, enabling the system to conduct binary searches to find matches as a faster alternative to bit by bit searching.

It is important that the key-value pairs be chosen carefully to minimize expected encoding length, i.e., the average deflation/compression ratio is minimized. It is possible to achieve the best possible expected code length among all instantaneous codes using Huffman codes if one has access to the exact probability distribution of source words of desired length from the random variable generating them. In practice, this is impossible, as data comes in a virtual infinitude of formats and the random processes underlying the source data are an inscrutable mix of human input, unpredictable (but in principle deterministic) physical events, and noise. Therefore, in some embodiments, this problem is addressed via a two-pronged approach: restriction of data type and density estimation. Users will provide a corpus of training files that is representative of the type of data they intend to transmit. The system will then model the distribution of (binary) strings in the data in order to build a Huffman code.

In some embodiments, probability distribution of source words for a variety of lengths t may be estimated using empirical word frequencies learned from the training data. While empirical frequencies are, in many senses, the optimal choice of estimator for probabilities, the actual observed word distribution has unavoidably smaller support than the true probability distribution function. That is, there will always be words which are unobserved during training but which nonetheless need to be encoded at run-time. This problem, which is defined herein as "mismatch" (since such words will not match to library keys) may be handled first by reserving a special mismatch indicator codeword followed by a plaintext copy of the source word. Decoding will simply strip off the mismatch codeword and put the next t bits into the decoded data stream. In other embodiments, a second approach, called "hybrid coding", may be employed to handle mismatches. In hybrid coding, a second Huffman code for much shorter codewords (perhaps just a byte or two) will be constructed that has an encoding of every possible source word, thus ensuring that all strings can be encoded. Larger values of t give the best ratio for the primary coding, so this hybrid coding is supplementary to ensure all source words can be encoded while maximizing deflation. In an aspect of some embodiments, the mismatch code may be coded into the Huffman codebook, thus guaranteeing that the Huffman coding is self-punctuating (i.e., pre-fix free), even with mismatches, and that decoding is unambiguous.

In some embodiments, the mismatch frequency may be calculated using one or more of a variety of methods, such as using an exponentially weighted moving average with varying weight ratios, or alternately, by estimating the probability q, building a code, computing an empirical new value for q and repeating.

In some embodiments, pruning may be used to reduce the size of the key-value pair library. In pruning, the fraction of least-probable library entries whose probabilities add up to some threshold are removed from the library. Pruning would be expected to have only a small impact on the deflation factor, because the removed words are the most infrequently observed ones, but the fraction of words removed will be large because samples drawn from asymptotically normal distributions (such as the log-probabilities of words generated by a probabilistic finite state machine, a model well-suited to a wide variety of real world data) which occur in tails of the distribution are disproportionately large in counting measure. This saves memory by reducing library size without impacting performance significantly.

In some embodiments, delta-encoding may be used, wherein two streams are encoded, transmitted, and decoded: a primary stream in which approximate source words are encoded using Huffman coding, and a secondary stream in which the delta between true source words and the approximate source words is encoded using an encoding optimized for low-weight sources such as Golomb coding, run-length encoding, and similar. The approximate source words may be chosen by locality sensitive hashing so as to approximate Hamming distance without incurring the intractability of nearest neighbor search in Hamming space. During operation, substrings of bits may be treated as unsigned binary integers. For appropriate choices of parameters, two strings s and s' may be expected to have the same Min Hash value $F(s)=F(s')$ with high probability, if and only if they are close in Hamming distance (that is, they differ only in a few bits). This value may then be used instead of s according to the algorithms described above for computing empirical frequencies, and then a Huffman code for all Min Hash values $F(s)$. This Huffman code is stored in a library along with a dictionary of key-value pairs $(s,F(s))$ for representative strings s. The library, dictionary, and a description of the Min Hash function F may then be shared between sender and receiver before transmission. When a source word s is to be encoded, the system computes $F(s)$ and looks this value up in the library to obtain a corresponding codeword. This codeword y is sent to the primary transmission stream, and the system looks up win the dictionary to obtain a representative codeword s'. Then the delta word is computed using a binary XOR function $\delta=s$ XOR $s'$. Because a delta word is expected to be small (that is, comprise only a few bits), a code optimized for encoding low-weight codewords may be used to send a transmission parallel to the transmission of y. Various algorithms may be used for this including, but not limited to, run-length encoding or Golomb coding. An exemplary algorithm based on co-lexicographic ordering is naturally suited to this task and very fast in use. First, the Hamming weight $w=/\delta/$ is computed, and then the function colex($\delta$), equal to the index of the subset of bits at which a "1" occurs in $\delta$ among the $C(t,w)$ (the binomial coefficient for t and w) subsets of [t] of weight w, listed in colexicographic order. This integer between 0 and $C(t,w)-1$ is then written in binary with exactly $u=\lfloor \log_2 C(t,w)-1 \rfloor+1$ bits, prepended with the unary representation of w followed by a 0 bit, and transmitted on the delta transmission stream. To decode the transmission, the receiver matches a codeword in the transposed library, and then looks up its corresponding Min Hash value. This value is then looked up in the dictionary to find a representative codeword s'. At the same time, the delta stream is examined for its first 0 bit since the last delta word was recorded; the number of/s before it is recorded as w, and the next u bits are read and decoded by inverting the function colex(•), which can also be done very quickly with standard combinatorial enumeration techniques. The resulting delta word $\delta$, having been obtained by this process, is then used to compute $s=s'$ XOR $\delta$, which is an exact reconstruction of the original source word s.

In some embodiments, parameter optimization may be used, wherein best-practice parameter/hyperparameter optimization strategies such as stochastic gradient descent, quasi-random grid search, and evolutionary search are used to make the optimal choices for parameters of the system. Such parameters may include, but are not limited to, the length t of encoded source words, delta-encoding parameters, pruning aggressiveness, size of secondary Huffman code source words, and whether delta-encoding or hybrid codes are used or not (and which encodings are used for the delta stream if so).

It should be noted that, although the techniques described above are directed toward lossless algorithms, they could be combined serially with lossy compression algorithms in appropriate applications.

The skilled person will be aware of a range of possible modifications of the various aspects described above. Accordingly, the present invention is defined by the claims and their equivalents.

What is claimed is:

1. A system for high-speed transfer of small data sets, comprising:
   a customized library generator comprising at least a plurality of programming instructions stored in the memory of, and operating on at least one processor of, a computing device, wherein the plurality of programming instructions, when operating on the at least one processor, cause the computing device to:
receive a first dataset comprising a plurality of words, each word comprising a string of bits, wherein the first dataset representative of subsequent datasets;
count the plurality of words to produce an occurrence frequency for each word;
create a first Huffman binary tree based on the frequency of occurrences of each word in the first dataset;
assign a Huffman codeword to each observed word in the first dataset according to the first Huffman binary tree;
construct a word library, wherein the word library stores the codewords and their corresponding words as key-value pairs in the library of key-value pairs;
create a second Huffman binary tree with a maximum codeword length shorter than the maximum codeword length in the first Huffman binary tree, and containing all combinations of such codewords of that shorter maximum length;
assign a word to each Huffman codeword in the second Huffman binary tree; and
add each word and its corresponding codeword, to the word library as key-value pairs in the library of key-value pairs;
a transmission encoder comprising at least a plurality of programming instructions stored in the memory of, and operating on at least one processor of, a computing device, wherein the plurality of programming instructions, when operating on the at least one processor, cause the computing device to:
receive one or more subsequent datasets, each comprising a plurality of words, each word comprising a string of bits;
compare each word in the subsequent dataset or datasets against the word library;
if a word is not a mismatch, append the word's codeword to a transmission data stream;
if a word is a mismatch, append a mismatch code to the transmission data stream followed by the unencoded word; and
transmit or store the transmission data stream;
a transmission decoder, comprising at least a plurality of programming instructions stored in the memory of, and operating on at least one processor of, a computing device, wherein the plurality of programming instructions, when operating on the at least one processor, cause the computing device to:
receive one or more datasets, each comprising a plurality of codewords, each codeword comprising a string of bits;
compare each codeword in the dataset or datasets against the word library;
if a codeword is not a mismatch, append the codeword's word to a transmission data stream;
if a codeword is a mismatch codeword, discard the mismatch code and append the following word to the transmission data stream; and
transmit or store the transmission data stream;
a hybrid encoder comprising at least a plurality of programming instructions stored in the memory of, and operating on at least one processor of, a computing device, wherein the plurality of programming instructions, when operating on the at least one processor, cause the computing device to:
receive mismatched words from the transmission encoder;
parse the mismatched words into partial words that correspond to a codeword in the second Huffman tree; and
return the codeword for each partial word to the transmission encoder; and
a hybrid decoder comprising at least a plurality of programming instructions stored in the memory of, and operating on at least one processor of, a computing device, wherein the plurality of programming instructions, when operating on the at least one processor, cause the computing device to:
receive mismatched codewords from the transmission decoder;
compare each codeword against the word library; and
return the word associated with the mismatched codeword to the transmission encoder.

2. The system of claim 1, wherein the library size is reduced by sorting the word library based on the occurrence probability of each key-value pair and removing low-probability key-value pairs.

3. The system of claim 1, wherein delta encoding is applied to a plurality of words to store an approximate codeword as a value in the word library, for which each of the plurality of source words is a valid corresponding key.

4. The system of claim 3, wherein the exclusive or (XOR) correction resulting from the delta encoding is discarded, resulting in a faster, but lossy compression algorithm.

5. The system of claim 1, wherein parameters of the system are optimized according to the datasets being used.

6. A method for high-speed transmission of small data sets using a word library, comprising the steps of:
receiving a first dataset comprising a plurality of words, each word comprising a string of bits, wherein the first dataset representative of subsequent datasets;
counting the plurality of words to produce an occurrence frequency for each word;
creating a first Huffman binary tree based on the frequency of occurrences of each word in the first dataset;
assigning a Huffman codeword to each observed word in the first dataset according to the first Huffman binary tree;
constructing a word library, wherein the word library stores the codewords and their corresponding words as key-value pairs in the library of key-value pairs;
creating a second Huffman binary tree with a maximum codeword length shorter than the maximum codeword length in the first Huffman binary tree, and containing all combinations of such codewords of that shorter maximum length;
assigning a word to each Huffman codeword in the second Huffman binary tree;
adding each word and its corresponding codeword, to the word library as key-value pairs in the library of key-value pairs;
receiving, at a transmission encoder one or more subsequent datasets, each comprising a plurality of words, each word comprising a string of bits;
comparing each word in the subsequent dataset or datasets against the word library;
if a word is not a mismatch, appending the word's codeword to a transmission data stream;

if a word is a mismatch, appending a mismatch code to the transmission data stream followed by the unencoded word;

transmitting or storing the transmission data stream;

receiving, at a transmission decoder, one or more datasets, each comprising a plurality of codewords, each codeword comprising a string of bits;

comparing each codeword in the dataset or datasets against the word library;

if a codeword is not a mismatch, append the codeword's word to a transmission data stream;

if a codeword is a mismatch codeword, discard the mismatch code and append the following word to the transmission data stream;

transmitting or storing the transmission data stream;

receiving, at a hybrid encoder, mismatched words from the transmission encoder;

parsing the mismatched words into partial words that correspond to a codeword in the second Huffman tree;

returning the codeword for each partial word to the transmission encoder;

receiving, at a hybrid decoder, mismatched codewords from the transmission decoder;

comparing each codeword against the word library; and returning the word associated with the mismatched codeword to the transmission encoder.

7. The method of claim 6, wherein the library size is reduced by sorting the word library based on the occurrence probability of each key-value pair and removing low-probability key-value pairs.

8. The method of claim 6, wherein delta encoding is applied to a plurality of words to store an approximate codeword as a value in the word library, for which each of the plurality of source words is a valid corresponding key.

9. The system of claim 8, wherein the exclusive or (XOR) correction resulting from the delta encoding is discarded, resulting in a faster, but lossy compression algorithm.

10. The method of claim 6, wherein parameters of the system are optimized according to the datasets being used.

* * * * *